(12) United States Patent
Augenstein et al.

(10) Patent No.: US 7,098,822 B2
(45) Date of Patent: Aug. 29, 2006

(54) METHOD FOR HANDLING DATA

(75) Inventors: Oliver Augenstein, Dettenhausen (DE); Joerg Erdmenger, Waldenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/021,362

(22) Filed: Dec. 22, 2004

(65) Prior Publication Data

US 2005/0177547 A1 Aug. 11, 2005

(30) Foreign Application Priority Data

Dec. 29, 2003 (EP) .................................. 03104987

(51) Int. Cl.
*H03M 7/30* (2006.01)

(52) U.S. Cl. .................. 341/87; 707/101; 711/118; 711/170; 711/171

(58) Field of Classification Search .................. 341/87, 341/106; 711/139
See application file for complete search history.

(56) References Cited

U.S. PATENT DOCUMENTS

| | | | | |
|---|---|---|---|---|
| 5,237,675 A | * | 8/1993 | Hannon, Jr. .................. | 710/68 |
| 5,479,587 A | * | 12/1995 | Campbell et al. ........... | 358/1.17 |
| 5,734,892 A | * | 3/1998 | Chu ............................ | 707/101 |
| 6,195,024 B1 | * | 2/2001 | Fallon ......................... | 341/51 |
| 6,360,300 B1 | * | 3/2002 | Corcoran et al. ............ | 711/139 |
| 6,449,689 B1 | * | 9/2002 | Corcoran et al. ............ | 711/113 |
| 2004/0114195 A1 | * | 6/2004 | Ebner et al. ............ | 358/426.04 |
| 2005/0071579 A1 | * | 3/2005 | Luick .......................... | 711/154 |

* cited by examiner

*Primary Examiner*—Rexford Barnie
*Assistant Examiner*—Nguyen Khai
(74) *Attorney, Agent, or Firm*—Bryan W. Butler; Dillon & Yudell LLP

(57) ABSTRACT

A method, device and computer program for handling a data stream comprising a number of data objects, wherein for at least one of these data objects a decision is made whether a compression is conducted based on a value representing a compression factor of the data object.

5 Claims, 2 Drawing Sheets

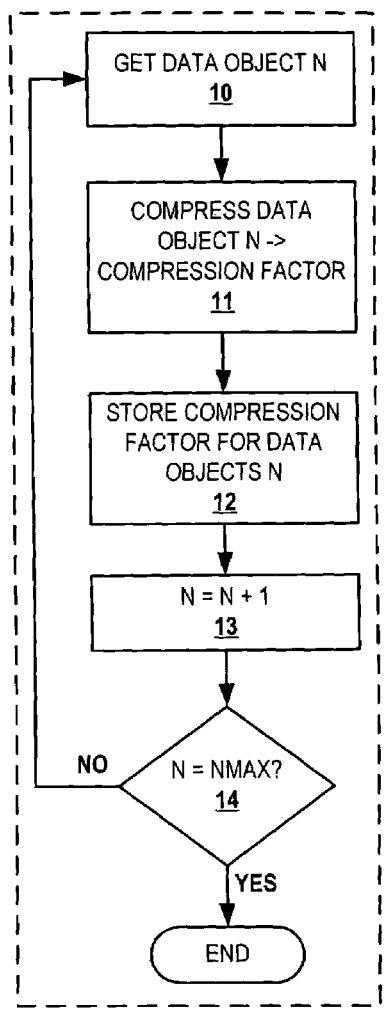
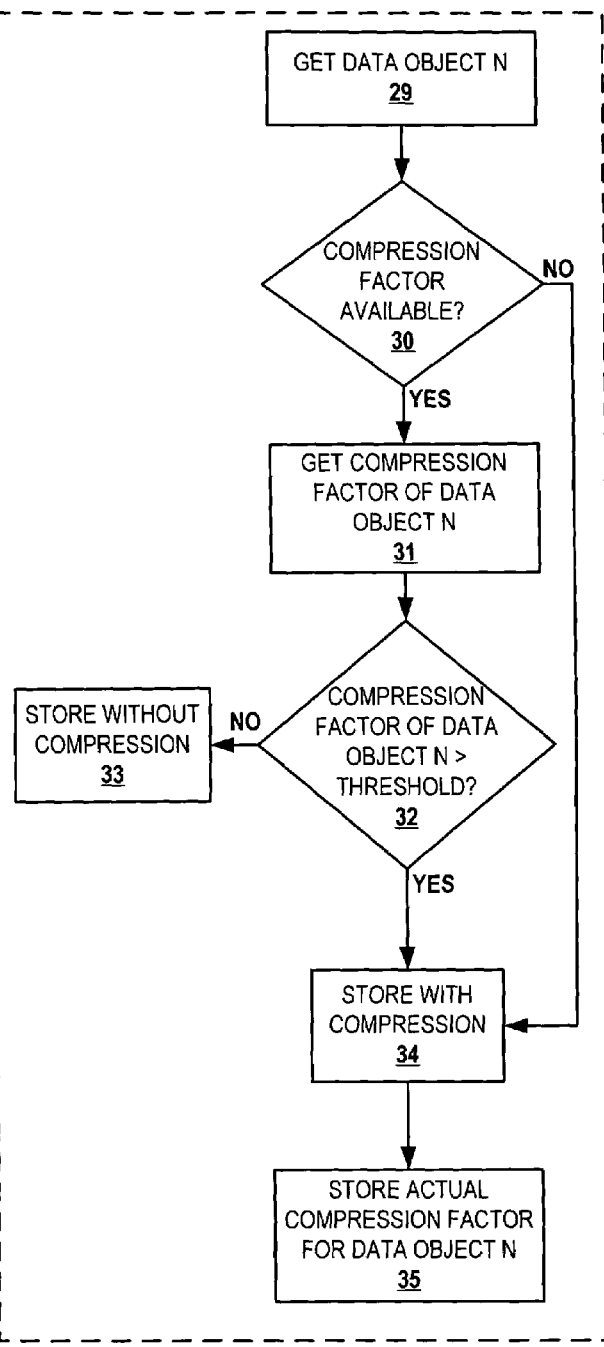
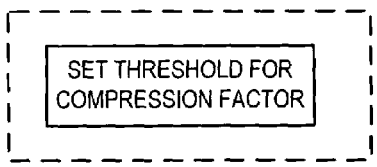
Figure 1A
Figure 1B
Figure 1C

METHOD FOR HANDLING DATA

PRIORITY CLAIM

This application claims priority of European Patent Application No. 03104987.7, filed on Dec. 29, 2003, and entitled, "Method For Handling Data."

BACKGROUND OF THE INVENTION

1. Technical Field

The present invention relates to the field of handling data and more particularly, to a method and a device for handling data comprising a number of data objects in order to compress this data. The invention further relates to a computer program product with a computer-readable medium and a computer program stored on the computer-readable medium with program coding means which are suitable for carrying out such a method when the computer program is run on a computer. Furthermore, the invention relates, to a method for setting up a repository.

2. Description of the Related Art

In database systems particularly in regularly updated database systems use of data compression methods is well-known in order to save storage capacity. Due to information entropy increase compression efficiency decreases over time. Accordingly, the compression process requires increasing processing resources and furthermore, reveals compression results having low compression ratios. Hence, if the entropy of the data to be compressed is very high, size reduction will be very low and the compression will not be effective. In this case, only additional processing power and processing time will be consumed by the compression. The compression factor, i.e. ratio of uncompressed data to compressed data, will then fall below an acceptable value. Therefore, at this point users often decide to switch off the compression.

Data to be compressed often consist of many single data objects having different compression rates. Although some of the data objects have a good compression rate the overall compression rate of the whole data stream may be unacceptable. The problem is that the system conducting the compression needs to have knowledge of the data objects before the compression. However, analyzing the data objects before compression requires additional processing power and time and therefore, is not a valid option.

A file compression processor monitoring current available capacity on a file unit has been proposed in U.S. Pat. No. 5,675,789. The disclosed method is based on a threshold driven compression of files dependent on the capacity of the file unit. U.S. Pat. No. 4,847,619 discloses an adaptive data compression system which is reset when performance drops below a predetermined threshold.

SUMMARY OF THE INVENTION

It is an object of the invention to provide a method for handling data which overcome the disadvantages known in the prior art. More particularly, it is an object of the invention to provide a method for handling data comprising a number of data objects which enables a good data size reduction of the overall data stream.

This object is achieved by proposing: (1) a method for handling data comprising a number of data objects, wherein for at least one of these data objects a decision is made whether a compression is conducted based on a predetermined value representing a compression factor of said data object; and (2) a device for handling a data stream comprising a number of data objects, where the device includes: decision means for deciding whether a compression is conducted based on values representing compression factors of said data objects; and compression means for compressing the data objects.

Thus, according to the present invention, a method for handling data comprising a number of data objects is proposed, wherein for at least one of the data objects, a decision is made whether a compression is conducted or not, whereby the decision is based on a value representing a compression factor of said data object.

With this invention, it is possible to achieve a good data size reduction of data comprising a number of data objects, even though the consumed processing power is low.

Preferably, the value is compared with a threshold value and a compression on said data object is conducted when the stored value does not exceed the threshold value. This threshold value can be empirically determined.

Advantageously, a repository is provided comprising a number of values, each of which represents a compression factor assigned to a certain data object. The values stored in the repository can be dynamically adapted, i.e. the stored compression factor will be replaced by the actual compression factor.

According to a preferred embodiment, the data is to be stored into a database and the method comprises the steps of receiving the data, for each data object, deciding whether a compression is to be conducted based on the assigned value stored in the repository and storing compressed data objects having an acceptable compression factor and data objects having an unacceptable compression factor without compression into the database. The actual compression factors can be stored into the repository possibly replacing former compression factors.

The invention also covers a method for setting up a repository, wherein data comprising a number of data objects is to be compressed, comprising the following steps: successively compressing the data objects, determining the compression factor for each single data object and storing determined compression factors into the repository.

The device for handling data comprises decision means for deciding whether a compression is conducted based on values representing compression factors of said data objects and compression means for compressing the data objects.

Preferably, the device further comprises a repository containing a number of values, each of which represents a compression factor assigned to a certain data object.

Advantageously, the device further includes a database for storing compressed data objects having an acceptable compression factor and data objects having an unacceptable factor without compression.

Furthermore, the invention covers a computer program product with a computer-readable medium and a computer program stored on the computer-readable medium with program coding means which are suitable for carrying out the above described method when the computer program is run on a computer.

Further features and embodiments of the invention will become apparent from the description and the accompanying drawings.

It will be understood that the features mentioned above and those described hereinafter can be used not only in the combination specified but also in other combinations or on their own, without departing from the scope of the present invention.

The invention is schematically illustrated in the drawings by way of example and is hereinafter explained in detail with reference to the drawings. It is understood that the description is in no way limiting on the scope of the present invention and is merely an illustration of a preferred embodiment of the invention.

BRIEF DESCRIPTION OF THE DRAWINGS

Other aspects and advantages of the invention will become apparent upon review of the detailed description and upon reference of the drawings in which:

FIGS. 1A–1C show sequence flows illustrating related procedures according to the present invention.

DESCRIPTION OF THE PREFERRED EMBODIMENTS

Figure 2:
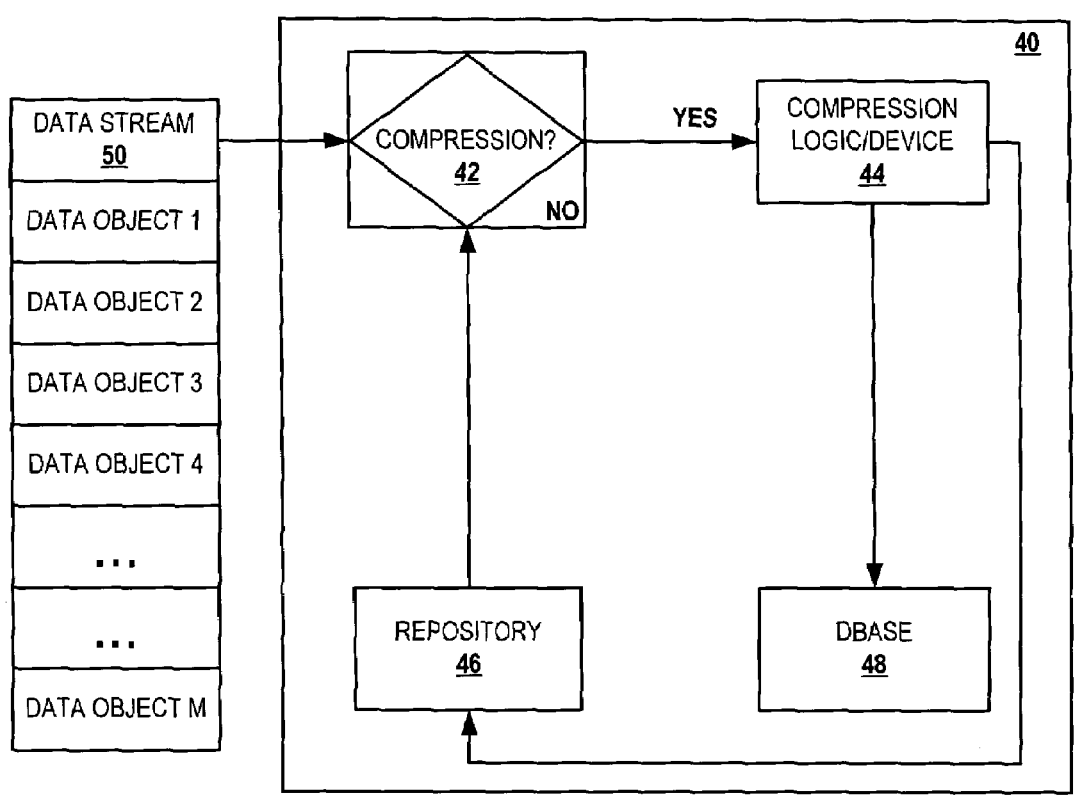
FIG. 2 is a schematic block diagram showing a device according to the present invention.

The invention permits users to compress data comprising a number of different data objects and to store the data objects with compression or without compression into a data repository consuming low processing power and achieving good data size reduction.

FIGS. 1A–1C show three different procedures according to the present invention respectively encircled by dashed lines. Procedure 1 illustrates the method for setting up a repository. This procedure can be performed optionally. In a first step 10 a particular data object n, typically the first data object, is extracted from a data stream to be compressed. In a next step 11 the data object n is compressed using a suitable compression method. The determined compression factor for data object n is stored into a repository in such a way that the value of the compression factor can be accessed by indicating the assigned data object n (step 12). Subsequently, in step 13, n is increased by 1 until all data objects of the data stream have been compressed, i.e. n=nmax in step 14.

Based on the results of procedure 1, a threshold value for the compression factor can be set in procedure 2 (step 20). In another embodiment of the present invention the threshold value is a default value.

Procedures 1 and 2 should be performed before starting procedure 3, realizing a preferred embodiment of the method for handling a data stream according to the present invention. In a first step 29, a particular data object n is extracted from a data stream to be compressed. In a second step 30 it is determined whether a compression factor for said data object is available or not. If it is available, the compression factor for this particular data object is determined by retrieving the value from the repository in step 31. If not the data object can be stored with compression and the determined compression factor is stored.

Subsequently, the read-out compression factor is compared with the set threshold value. Based on that comparison the decision is made whether a compression is conducted or not (step 32). In case that compression factor is unacceptable, data object n will be stored into the data repository without compression, as indicated in step 33.

In case that compression factor is acceptable, data object n will be compressed and stored into the database with compression (step 34). Furthermore, the actual compression factor will be stored into the repository in step 35.

The illustrated procedure 3 can be performed for any data object. Preferably, it is performed successively for data objects consecutively ordered in the data stream. In case that there is no respective compression factor in the repository for the data object to be compressed, compression will be performed. In that case, the determined new compression factor will be stored into the repository afterwards.

Referring to FIG. 2, a device 40 for handling a data stream comprises a decision means 42 for deciding whether a compression is conducted, a compression means 44 for compressing data objects, a repository 46 and a database 48.

A data stream 50 comprising a number of data objects will be handled by the device 40 according to the present invention. For each data object, decision means 42 compares an assigned compression factor read-out from the repository 46 with a previously determined threshold value or watermark, respectively in order to decide whether the respective data object will be compressed or not.

Data objects which do not have a known compression rate will be compressed and the compression rate utilized is saved into the repository. Data objects having a known compression rate below a defined watermark will not be compressed. Data objects with a known compression rate above a defined watermark will be compressed.

The watermark can be adjusted depending on the needs for the effected system. It may be lower for systems where the bandwidth is the main issue or it may be higher for systems where processing power is the main issue. Furthermore, the watermark can be empirically determined.

In case that the compression rate is acceptable, the data is compressed using the compressing means 44. The compressed data object is stored into the database 48. The actual compression rate for said data object is stored into the repository replacing the former compression factor.

In case that the compression rate of the data object to be compressed and stored is not acceptable, a compression of said data object is not conducted and the data object is stored into the data repository without compression.

As a final matter, it is important that while an illustrative embodiment of the present invention has been, and will continue to be, described in the context of a fully functional computer system with installed management software, those skilled in the art will appreciate that the software aspects of an illustrative embodiment of the present invention are capable of being distributed as a program product in a variety of forms, and that an illustrative embodiment of the present invention applies equally regardless of the particular type of signal bearing media used to actually carry out the distribution. Examples of signal bearing media include recordable type media such as floppy disks, hard disk drives, CD ROMs, and transmission type media such as digital and analogue communication links.

While the invention has been particularly shown and described with reference to a preferred embodiment, it will be understood by those skilled in the art that various changes in form and detail may be made therein without departing from the spirit and scope of the invention.

What we claim is:

1. A method for handling data comprising a number of data objects, said method comprising:

for at least one of these data objects, determining whether a compression is conducted based on a predetermined value representing a compression factor of said data object;

dynamically adjusting a threshold based on system needs, wherein the threshold is lowered for a system where the bandwidth is a greater concern than processing power and the threshold is increased for a system in which the processing power is a greater concern than bandwidth;

comparing the value with a threshold value, wherein said threshold value is empirically determined via said dynamically adjusting step;

performing a compression on said data object when the predetermined value does not exceed the threshold value;

wherein the data is to be stored into a data repository, the method further comprising the steps of:

receiving a data stream comprising the number of data objects;

for each data object, deciding whether a compression is to be conducted based on the assigned value stored in the repository representing the compression factor of the respective data object;

compressing the data that is identified as having an acceptable compression factor;

determining the actual compression factor utilized to compress the data;

storing compressed data objects having an acceptable compression factor and data objects having an unacceptable compression factor without compression into the data repository; and storing actual compression factors determined from the compression of the data into the repository.

2. A method according to claim 1, wherein the repository is provided comprising a number of values, each of which represents a compression factor assigned to a certain data object, wherein said values stored in the repository are dynamically adapted, wherein said storing further comprises:

where a previous compression factor is present within the repository for the compressed data, replacing the previous compression factor with the actual compression factor; and when no previous compression factor is present within the repository for the data, compressing the data and determining a compression factor of the compressed data, before storing the compressed data and the new compression factor in the repository.

3. A computer program product with a computer-readable medium and a computer program stored on said computer-readable medium with program coding means which are suitable for carrying out a method according to claim 1 when said computer program is run on a computer.

4. A computer program product comprising a computer-readable medium and a computer program stored on the computer-readable medium with program coding means which are suitable for carrying out a method according to claim 2 when said computer program is run on a computer.

5. A device for handling a data stream comprising a number of data objects, said device comprising:

decision means for deciding whether a compression is conducted based on values representing compression factors of said data objects;

adjusting means for dynamically adjusting a threshold based on system needs, wherein the threshold is lowered for a system where the bandwidth is a greater concern than processing power and the threshold is increased for a system in which the processing power is a greater concern than bandwidth;

comparing means for comparing the values with a threshold value, wherein said threshold value is empirically determined via said dynamically adjusting step;

compression means for compressing the data objects that are identified as having an acceptable compression factor;

determining means for determining the actual compression factor utilized to compress each single data object;

a database for storing compressed data objects having an acceptable compression factor and data objects having an unacceptable compression factor without compression; and storage means for storing determined compression factors, determined from the compression of the data, into a repository, wherein the repository comprises a number of values, each of which represents a compression factor assigned to a certain data object.

\* \* \* \* \*